United States Patent [19]

Page

[11] Patent Number: 4,524,430
[45] Date of Patent: Jun. 18, 1985

[54] DYNAMIC DATA RE-PROGRAMMABLE PLA

[75] Inventor: David W. Page, San Diego, Calif.

[73] Assignee: Burroughs Corporation, Detroit, Mich.

[21] Appl. No.: 457,177

[22] Filed: Jan. 11, 1983

[51] Int. Cl.$^3$ ............................................. G11C 13/00
[52] U.S. Cl. .................................. 365/189; 365/230; 365/221; 340/825.27
[58] Field of Search ............... 365/189, 230, 183, 221, 365/149; 340/825.21, 825.27

[56] References Cited

U.S. PATENT DOCUMENTS 4,422,160  12/1983  Watanabe ............................ 365/189

Primary Examiner—Terrell W. Fears
Attorney, Agent, or Firm—Charles J. Fassbender; J. Ronald Richbourg; Kevin R. Peterson

[57] ABSTRACT

A re-programmable logic array is disclosed which has an AND array disposed for receiving n input signals on n rows of m cells per row, and an OR array providing k output lines on k rows of m cells per row. The AND and OR arrays are coupled together by m term lines. Each of the rows of the AND and OR arrays include shift register means of m charge storage elements having an input terminal coupled to the first of the m charge storage elements and an output terminal coupled to the mth one of the m charge storage elements. Multiplexors are coupled to each of the rows of both the AND and OR arrays to select between a programming operation and a recirculating refresh operation.

16 Claims, 7 Drawing Figures

4,524,430

DYNAMIC DATA RE-PROGRAMMABLE PLA

RELATED U.S. PATENT APPLICATIONS

U.S. patent applications directly or indirectly related to the subject application are the following:

Ser. No. 457,175, filed 11 Jan. 1983 by David W. Page and LuVerne R. Peterson and entitled "A Re-programmable PLA", and Ser. No. 457,176, filed 11 Jan. 1983 by Fazil I. Osman and entitled "A Dynamic Re-programmable PLA".

BACKGROUND OF THE INVENTION

This invention relates to programmable logic arrays (PLA's), and more particularly, to PLA's which are readily re-programmable.

In general, a PLA is a logic circuit which receives a plurality of digital input signals and generates a plurality of digital output signals wherein each of the digital output signals is a programmable sum-of-product combination of the input signals. In conventional PLA's, one circuit is provided for generating a plurality of terms which are the logical AND of selected input signals; and another circuit is provided to generate the output signals by selectively ORing the AND terms. A typical PLA may have a total of n input signals, generate a total of m AND terms from the input signals, and generate a total of k output signals by selectively ORing the m AND terms.

An article describing PLA's in more detail is "Field-PLA's Simplify Logic Designs", which was published in *Electronic Design* of Sep. 1, 1975, at pages 84–90. Another series of articles describing PLA's are "Field-programmable Arrays: Powerful Alternatives to Random Logic", *Electronics*, July 5, 1979, pages 89–94; and "Field-programmable Logic, Part 2: Sequencers and Arrays Transform Truth Tables into Working Systems", *Electronics*, July 19, 1979, pages 95–102.

The general design of a PLA includes an AND array feeding into an OR array. These data lines feed an array of terms m deep. Each term is the AND combination of data, data complement and don't care for each input (don't care is formed by ignoring data and data complement for a given input), hence a typical program may appear as:

term $1 = A \wedge B$
term $2 = \bar{A} \wedge B$
term $m = \bar{B}$

The term lines then feed into an OR array where each term line may be selectively OR'd into an output (the array is $m \times k$ where k is the number of outputs).

The prior art PLA's are typically designed for use in systems requiring permanent or semipermanent nonvolatile logic arrays. PROM's (programmable read only memories) are frequently used to implement logic arrays, which PROM's are usable only once after programming (i.e., the program cannot be changed once made). EPROM's (erasable PROM's) can be changed by the use of an ultraviolet light, which erasure requires several hours to complete. Also, another problem with EPROM's is that they are expensive.

EEPROM's (electrically erasable PROM's), which are even more expensive than EPROM's, require special power supplies. Furthermore, PROM's are not configured as PLA's.

SUMMARY OF THE INVENTION

An advantage of the present invention resides in the provision of a unique design that is readily adaptable to standard MOS (metal oxide semiconductor) fabrication techniques.

Another advantage of this invention is the provision of a PLA design that is readily programmable or re-programmable as required, and requires reduced semiconductor chip area ("real estate").

A re-programmable logic array is provided which has an AND array disposed for receiving n input signals on n rows of m cells per row, and an OR array providing k output lines on k rows of m cells per row. The AND and OR arrays are coupled together by m term lines. Each of the rows of the AND and OR arrays include shift register means of m charge storage elements having an input terminal coupled to the first of the m charge storage elements and an output terminal coupled to the mth one of the m charge storage elements. A multiplexor means is also included in each row which has a first input terminal coupled to the output terminal of the shift register means, a second input terminal disposed for receiving program data and an output terminal coupled to the input terminal of the shift register means. The multiplexor means is adapted to select between the first and second input terminals in response to the state of a multiplexor select signal.

DETAILED DESCRIPTION OF A PREFERRED EMBODIMENT

Figures 1, 1A:
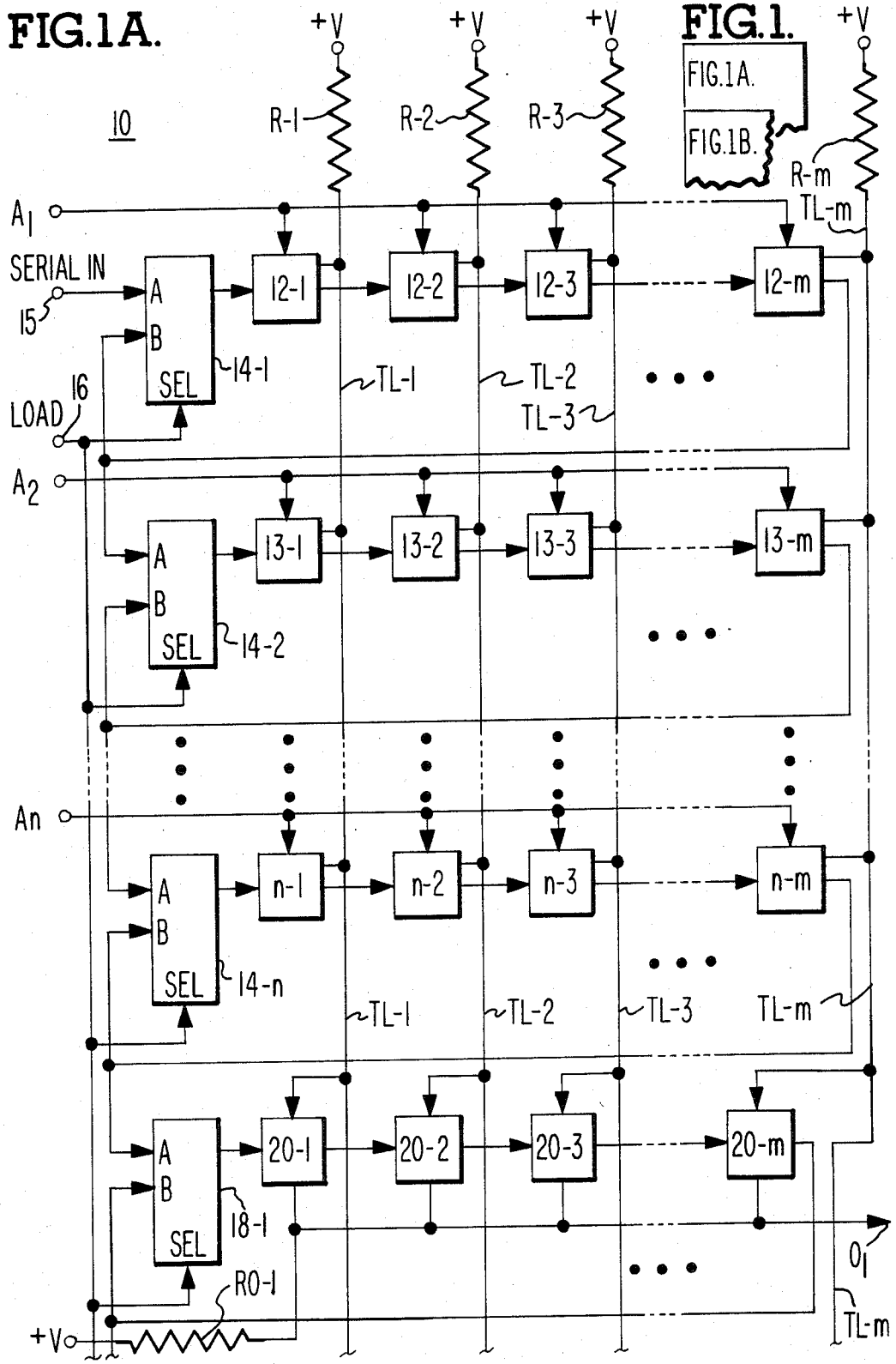
FIG. 1, which is comprised of FIGS. 1A and 1B, is a block diagram of a PLA constructed in accordance with this invention.
Figure 1B:
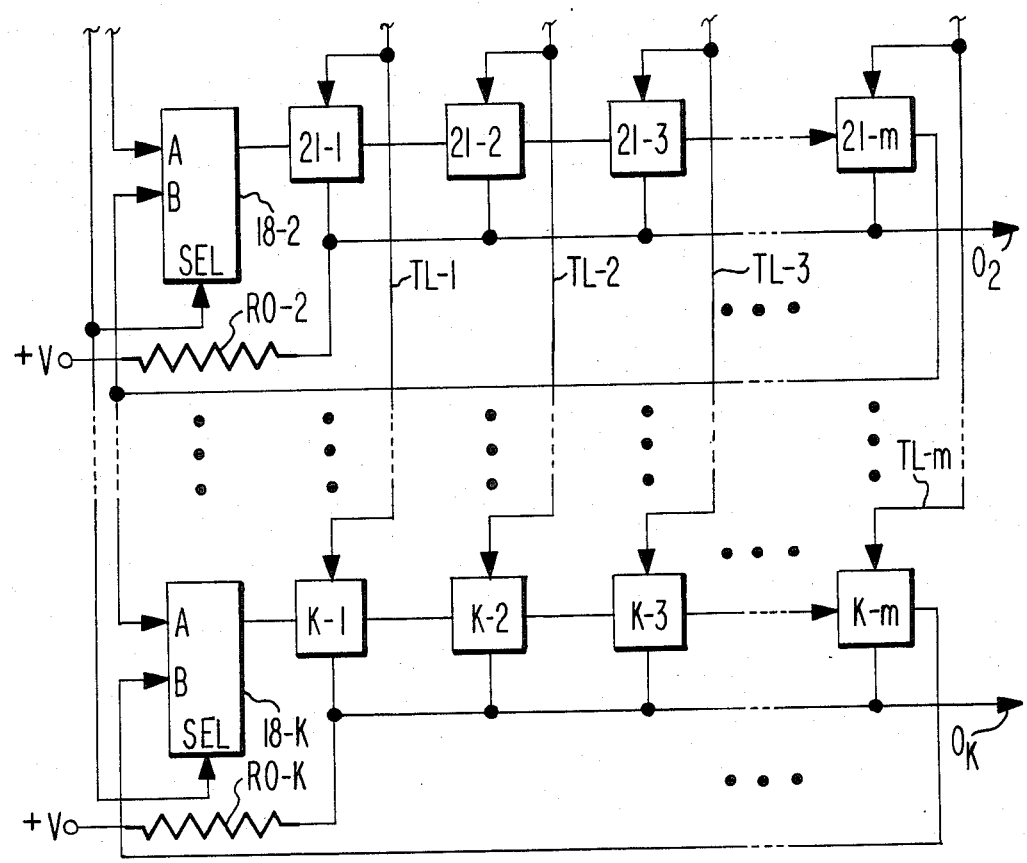

Referring now to the drawings, and FIG. 1 in particular, a block diagram of the programmable logic array (PLA) 10 of this invention is illustrated.

AND ARRAY

A multiplicity of program elements 12-1, 12-2, 12-3 ... 12-m, 13-1, 13-2, 13-3 ... 13-m, ... n-1, n-2, n-3 ... n-m are arranged in an array of m columns by n rows forming the AND array of the PLA. Multiplexors 14-1, 14-2 ... 14-n are coupled, respectively, to one end of each of the n rows of the AND array.

An address line $A_1$ is coupled to first input terminals of each of the first-row elements 12-1, 12-2, 12-3 ... 12-m. In a similar manner, address line $A_2$ is coupled to first input terminals of the second-row elements 13-1, 13-2, 13-3 ... 13-m; and, address line $A_n$ is coupled to the nth row of program elements. The PLA program is loaded into the array by supplying serialized bits of the program on a "SERIAL IN" input terminal 15 while at the same time applying a high-level signal on a LOAD input terminal 16. The input terminal 15 is coupled to the first (A) input terminal of the multiplexor 14-1, and the input terminal 16 is coupled to the select (SEL)

input terminals of the multiplexors 14-1, 14-2 ... 14-n. The output terminal of the multiplexor 14-1 is coupled to a second input terminal of the program element 12-1, and a first output terminal of the element 12-1 is coupled to a second input terminal of the element 12-2. This connection pattern is repeated for the balance of this row and each row of the AND array is arranged in a similar manner.

The output of the last program element 12-m of the first row is coupled back to the second (B) input terminal of the multiplexor 14-1 and to the first (A) input terminal of the second-row multiplexor 14-2. The output of the program element 13-m is coupled to the second (B) input terminal of the multiplexor 14-2 and to the A input terminal of the next-row multiplexor (not shown). The output of the last program element of the penultimate row of program elements (not shown) is coupled to the B input terminal of the multiplexor 14-n and to the A input terminal of a multiplexor 18-1 of the OR array described hereinbelow.

All of the program elements of both the AND and the OR arrays are driven by the same clock. When a high-level LOAD signal is applied on the terminal 16, the A input terminal of each of the multiplexors is selected. Hence, with the presence of the LOAD signal, a serial stream of data supplied on the SERIAL IN input terminal 15 will be shifted in a serpentine fashion through each of the rows of both the AND and the OR arrays.

A second output of each of the first column program elements 12-1, 13-1 ... n-1 is coupled to a term line TL-1, which term line is coupled to a voltage supply +V through a resistor R-1. In a similar manner, outputs of the second column elements are coupled to a term line TL-2, third column elements are coupled to a term line TL-3 and the last column elements are coupled to a term line TL-m.

OR ARRAY

The multiplexor 18-1 is coupled to the first row of program elements 20-1, 20-2, 20-3 ... 20-m of the OR array. A multiplexor 18-2 is coupled to the second row of elements 21-1, 21-2, 21-3 ... 21-m; and, multiplexor 18-k is coupled to the last row of elements k-1, k-2, k-3 ... k-m. The select (SEL) input terminals of the multiplexors 18-1, 18-2 ... 18-k are coupled to the LOAD input terminal 16. It should be noted that the program elements of the OR array are different from those of the AND array as will be described further hereinbelow.

In a manner similar to that described above with reference to the AND array, the output of the last element of each row is coupled back to the second (B) input terminal of the multiplexor coupled to that row and to the first input of the multiplexor coupled to the next subsequent row. Likewise, the term line TL-1 is coupled to second input terminals of each of the first column elements 20-1, 21-1 ... k-1. The term lines TL-2, TL-3 ... TL-m are similarly coupled to the elements of the second, third ... mth columns, respectively. A second output terminal of each of the first-row program elements 20-1, 20-2, 20-3 ... 20-m is coupled to an output line $O_1$. Similarly, the second row elements are coupled to an output line $O_2$ and the last row elements are coupled to an output line $O_k$. The output lines $O_1$, $O_2$ ... $O_k$ are biased at a high-level voltage (e.g., five volts) by means of resistors RO-1, RO-2 ... RO-k respectively, which are tied to a +V supply voltage.

Figure 2:
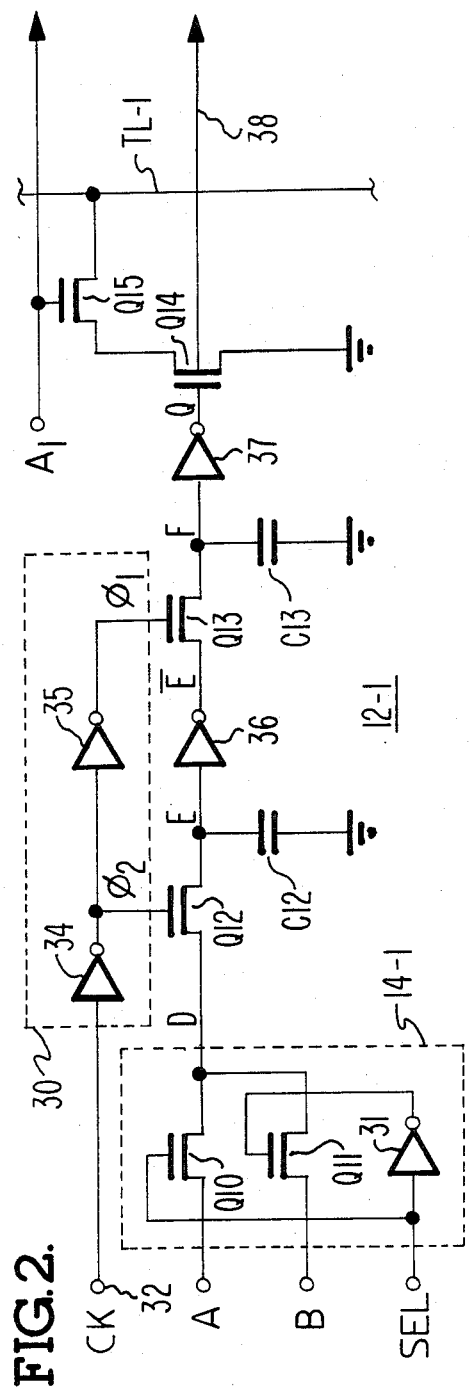
FIG. 2 is a schematic diagram of a typical multiplexor and a program element employed in the AND array of the PLA.

Referring now to FIG. 2, a schematic diagram of the multiplexor 14-1 and program element 12-1 employed in the AND array (FIG. 1) is shown. A clock circuit 30 is included for illustration only, which clock circuit divides a conventional clock signal of typically one to four megahertz into two complementary clock signals $\phi_1$ and $\phi_2$. It is noted that only one or two clock circuits such as the circuit 30 are employed in the entire array.

The A input terminal of the multiplexor 14-1 is coupled to the source terminal of a transistor Q10, and the B input terminal is coupled to the source terminal of another transistor Q11. The selector (SEL) input terminal is coupled to the gate terminal of Q10 and to the input terminal of an inverter 31. The output terminal of the inverter 31 is coupled to the gate terminal of Q11. The drain terminals of Q10 and Q11 are connected together and this connection is coupled to the output of the multiplexor 14-1, which is coupled to the source terminal of a transistor Q12 at a circuit node D.

The "CK" clock signal is supplied on a terminal 32, which is coupled to the input of an inverter 34 within the clock circuit 30. The output of the inverter 34 is the $\phi_2$ clock signal, and this output is coupled to the gate terminal of the transistor Q12 and to the input of an inverter 35. The output of the inverter 35 is the $\phi_1$ clock signal, and this output is coupled to the gate terminal of a transistor Q13. Hence, the $\phi_1$ and $\phi_2$ clock signals are 180° out of phase (i.e., $\phi_2$ is the complement of $\phi_1$).

The drain terminal of the transistor Q12 is coupled to the input terminal of an inverter 36 at a node E and the output terminal of this inverter is coupled to the source terminal of Q13 at a node $\bar{E}$. The drain terminal of Q13 is coupled to the input of an inverter 37 at a node F having an output terminal coupled to the gate terminal of a transistor Q14 and to the output of the element 12-1 on a line 38. A parasitic capacitance exists between the drain terminals of Q12 and Q13 and ground potential, which capacitors are referred to herein as C12 and C13. The line 38 is connected to the source terminal of a transistor within the next adjacent element 12-2 that corresponds to the source terminal of the transistor Q12. A high-level signal present at the circuit node D will be transferred to the circuit node E during the $\phi_2$ clock cycle. This signal level is retained by a charge on the capacitor C12. Simultaneously, the opposite logic level of E (i.e., $\bar{E}$) will be present at the output of the inverter 36. During the $\phi_1$ clock cycle, the output of the inverter 36 (i.e., $\bar{E}$) will be transferred to circuit node F whereupon it will appear inverted at the circuit node Q (line 38) as a result of the action of the inverter 37. The signal level at node F is retained by a charge on the capacitor C13.

The address line $A_1$ is coupled to the gate terminal of a transistor Q15 having a source terminal coupled to the term line TL-1. The drain terminal of Q15 is coupled to the source terminal of Q14 and the drain terminal of Q14 is coupled to ground potential.

Figure 3:
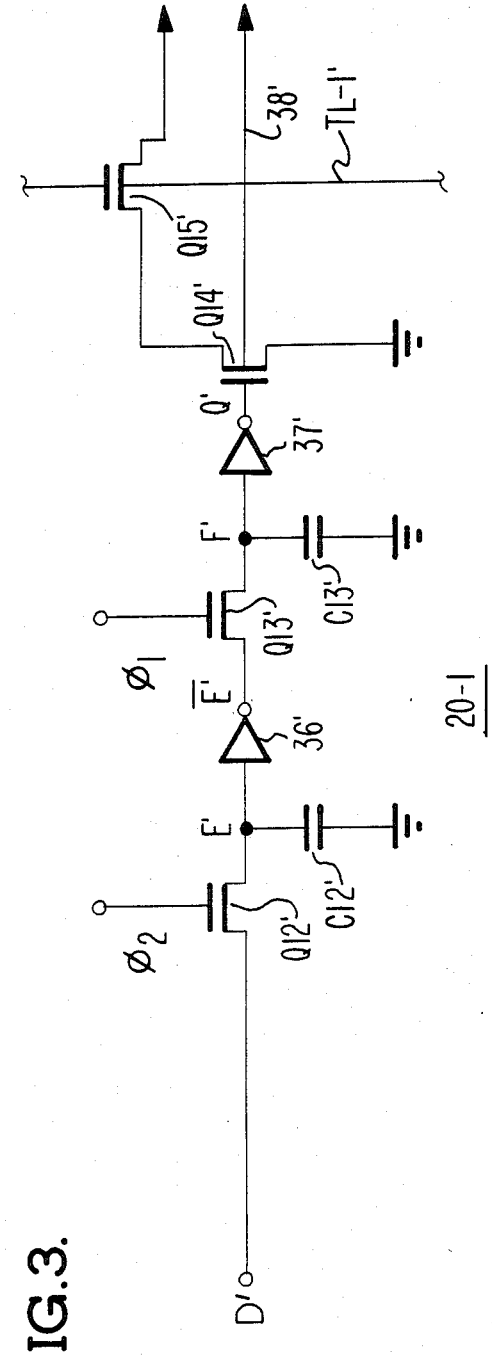
FIG. 3 is a schematic diagram of a typical program element employed in the OR array of the PLA.

Before describing the operation of the circuit shown in FIG. 2, reference is briefly made to FIG. 3 wherein the program element 20-1 of the OR array is shown for comparison purposes. Like reference numerals are used in FIG. 3 with the addition of a prime. The major difference between an AND array element and an OR array element is the manner in which Q15' is connected. Note in FIG. 2 that the gate to Q15 is controlled by an address line (e.g., $A_1$) and the source terminal is coupled to the term line TL-1. In the OR array element 20-1 the gate terminal of Q15' is coupled to the term line and the drain terminal is coupled to an output line (e.g., $O_1$).

Figure 4:
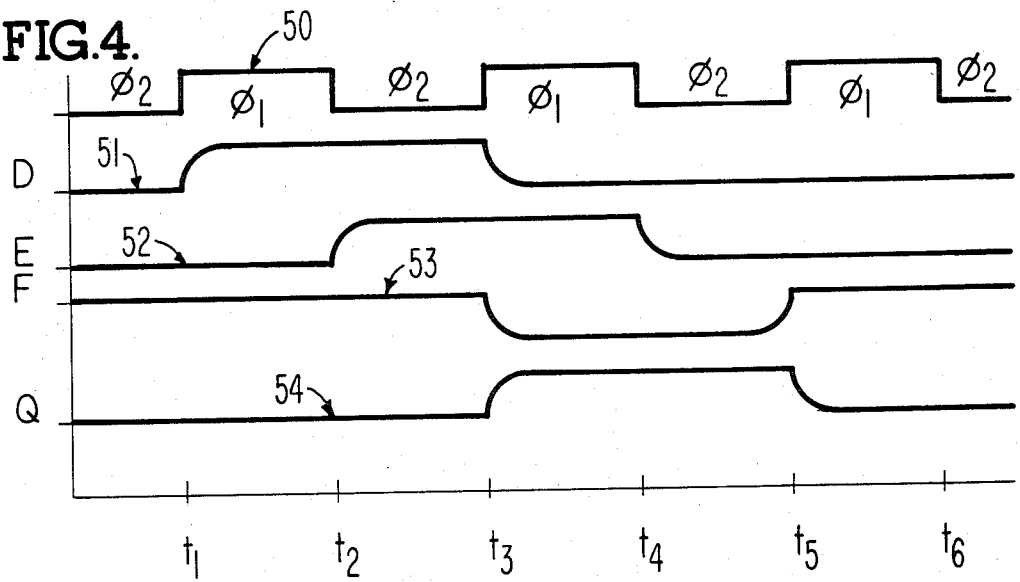
FIG. 4 is a timing diagram illustrating operation of the program element of the PLA; and, FIG. 5 is a sequence diagram useful in illustrating the operation of the PLA of this invention.

The operation of the circuits illustrated in FIGS. 2 and 3 may be more fully appreciated by referring to the timing diagram of FIG. 4. Waveform 50 represents the $\phi_1$ clock signal and the $\phi_2$ clock signal is the complement of $\phi_1$, as noted in the drawing. Waveform 51 illustrates a data bit (high-level signal) appearing at the input of the program element 12-1 (node D) by means of either Q10 or Q11 (input A or B, respectively) of the multiplexor 14-1. Waveform 52 illustrates the signal at the input of the inverter 36 (node E), and waveform 53 represents the signal at the input of the inverter 37 (node F). Waveform 54 represents the inverse of waveform 53 as inverted by the inverter 37 (node Q).

The high-level signal at the output of the inverter 37 (node Q), as represented by the waveform 54 between times $t_3$ and $t_5$ will turn on the transistor Q14. If a high-level signal is present on the address line $A_1$ at the same time, the term line TL-1 will be pulled down to ground potential. In a similar manner, a high-level signal at the output of the inverter 37' (FIG. 3) will turn on the transistor Q14'. If the term line TL-1 has not been pulled down to ground potential as in the previous example, Q15' will turn on (remember that the term line TL-1 is biased to +V through resistor R-1), which will cause the output line $O_1$ to drop to ground potential. On the other hand, if as in the previous example the term line TL-1 has been pulled down to ground potential, O15' will be turned off and the state of the line 38' would be irrelevant.

Once the PLA program has been loaded, that is all of the elements in both the AND and the OR arrays have been programmed as desired, the LOAD signal is removed (i.e., drops to a low level) from the terminal 16. As shown in FIG. 2, the transistor Q10 is turned off and the transistor Q11 is turned on. This occurs at the same time in all of the multiplexors 14-1, 14-2 . . . 14-n, 18-1, 18-2 . . . 18-k. The clock (CK) signals are continuously supplied to the program elements so that the program will circulate within each row. That is, the data stored in the element 12-1 will be shifted to the element 12-2, etc., and the data stored in the element 12-m will be shifted back to the element 12-1. It is this continuous circulation of the programmed data in each row that obviates refresh logic.

Figure 5:
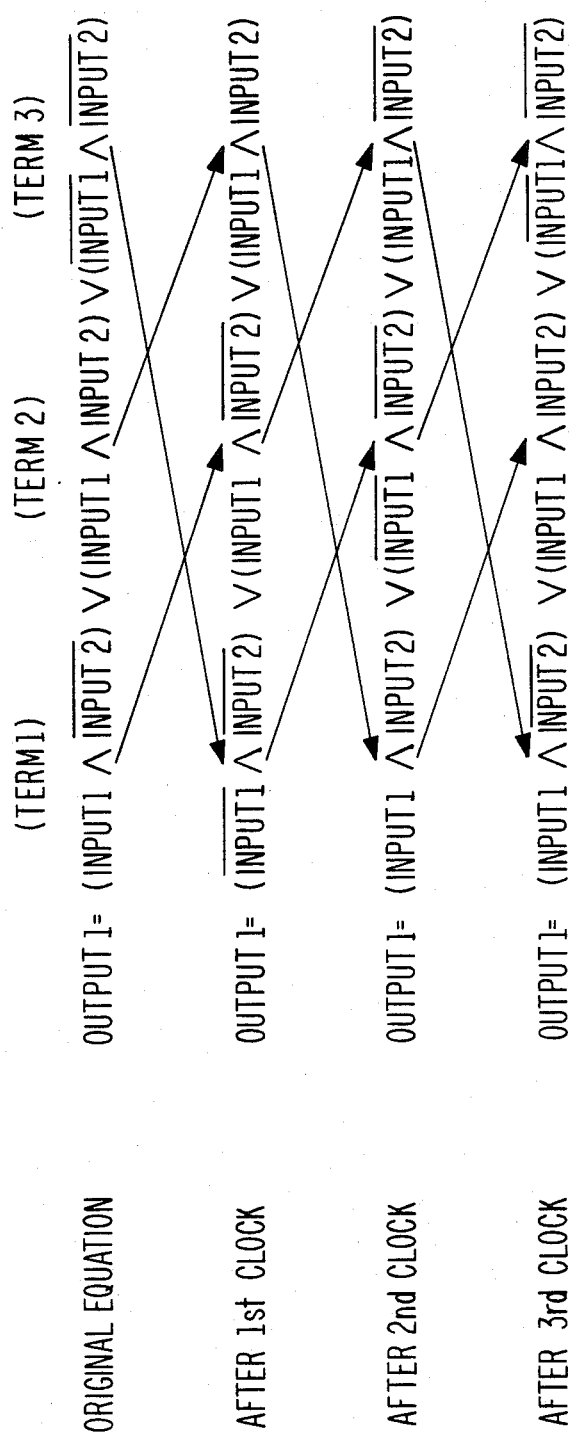

Assume, for purposes of illustration only, that m equals three. Reference is now made to the sequence diagram shown in FIG. 5, wherein a sample program of row one of the array is shown as "original equation". After the first clock cycle, term one is shifted to the term two position, with term three shifted to the term one position. This shifting is repeated continuously, and after the third clock cycle, all terms are returned to their original position. All of the intermediate states of the program elements of the array during the shifting operation are equivalent by the associative principle of mathematics. Accordingly, since the contents of both the AND and OR arrays are shifted simultaneously, the PLA of this invention (when used in a synchronous system) will operate the same as if the PLA contents were either fixed or static. In an asynchronous system, this PLA is substantially the same as a fixed or static PLA with minor variations in the timing of output versus input signals.

A static program element is larger in area (requires more silicon real estate) than are dynamic program elements. However, the data stored in a dynamic program element will decay with time and must be refreshed periodically. One approach for refreshing the program element is to use refresh logic as is typically employed in dynamic RAM's. Another approach that requires even less real estate is to continuously shift the data through amplifiers as is disclosed and claimed in this application.

Referring again to FIG. 2, the inverters 36 and 37 are also amplifiers that amplify the charge present on either capacitor C12 or C13. Stated otherwise, the charge on the capacitors will decay over time. However, the frequency of the clock is typically set sufficiently fast so as to restore the charge prior to it decaying below the threshold level of the inverters. Since the discharge time is approximately two milliseconds, the minimum clock frequency is 500 hertz. In one embodiment, however, the clock is set at a substantially higher frequency within the range of approximately one to four megahertz.

It may be appreciated from the discussion hereinabove that a re-programmable logic array has been described in detail. Thus, while the invention has been particularly shown and described with reference to only one embodiment, it will be understood by those skilled in the art that the foregoing and other changes in form and details may be made without departing from the spirit and scope of the appended claims.

I claim:
1. A re-programmable logic array comprising:
   a. an AND array disposed for receiving n input signals on n rows of m cells per row;
   b. an OR array providing k output lines on k rows of m cells per row, wherein n, m and k are integers greater than one;
   c. m term lines coupling said cells of said AND array to said cells of said OR array;
   d. each of said rows of cells of said AND and said OR arrays including:
      i. shift register means of m charge storage elements having an input terminal coupled to the first of said m charge storage elements and an output terminal coupled to the mth one of said m charge storage elements;
      ii. multiplexor means having a first input terminal coupled to said output terminal of said shift register means, a second input terminal disposed for receiving program data, an output terminal coupled to said input terminal of said shift register means, and a selector input terminal disposed for receiving a multiplexor select signal for selecting between said first and said second input terminals.

2. An array as in claim 1 further characterized by said second input terminal of said multiplexor means of the first row of cells of said AND array being coupled to a program data input terminal of said array.

3. An array as in claim 2 further characterized by a clock source coupled to all of said charge storage elements of both said AND and said OR arrays.

4. An array as in claim 3 further characterized by said second input terminal of each of said multiplexor means of the second through the n+k rows of data storage elements being coupled to the output terminal of the immediate preceding row shift register, whereby all of said charge storage elements are programmed by shifting serialized data supplied on said program data input terminal during one state of said multiplexor select signal and recirculating program data within each row of cells during a second state of said multiplexor select signal so as to refresh the programmed data on each of said charge storage elements.

5. An array as in claim 1 further characterized by each of said charge storage elements being a parasitic capacitance of an MOS flip-flop circuit.

6. An array as in claim 1 further characterized by each of said multiplexor means including a pair of transistors each having an input terminal coupled to respective input terminals of said multiplexor means, output terminals coupled together forming said output terminal of said multiplexor means and a control element, wherein said control element of the first of said pair of transistors coupled to said selector input terminal and an inverter coupled between said selector input terminal and the control element of the second of said pair of transistors.

7. An array as in claim 1 further characterized by each of said n×m cells in said AND array comprising first and second transistor means coupled in series between one of said term lines and a reference potential, said first transistor means having a control element coupled to one of said input signals and said second transistor means having a control element coupled to an output terminal of one of said charge storage elements.

8. An array as in claim 1 further characterized by each of said k×m cells in said OR array comprising third and fourth transistor means coupled in series between one of said output lines and a reference potential, said third transistor means having a control element coupled to one of said m term lines and said fourth transistor means having a control element coupled to an output of one of said charge storage elements.

9. A re-programmable logic array comprising:
   a. an AND array disposed for receiving n input signals on n input terminals and having m term lines, wherein n and m are integers greater than one, said AND array having n×m cells each of which comprises:
      i. first and second transistor means coupled in series between one of said term lines and a reference potential, each of said transistor means having a control element;
      ii. a first charge storage element coupled to the control element of said first transistor means;
      iii. one of said n input terminals being coupled to the control element of said second transistor means;
   b. an OR array providing k output lines and being coupled to said AND array by said term lines wherein k is an integer, said OR array having m×k cells each of which comprises:
      i. third and fourth transistor means coupled in series between one of said output lines and a reference potential, each of said transistor means having a control element;
      ii. a second charge storage element coupled to the control element of said third transistor means; and,
      iii. one of said m term lines being coupled to the control element of said fourth transistor means.

10. A re-programmable logic array as in claim 9 further characterized by a multiplexor means having a first input terminal coupled to the mth cell of each row of said cells, a second input terminal disposed for receiving program data, an output terminal coupled to the first cell of each row of cells and a selector input terminal disposed for receiving a multiplexor select signal for selecting between said first and said second input terminals.

11. A re-programmable logic array as in claim 10 further characterized by said second input terminal of said multiplexor means of the first row of cells of said AND array being coupled to a program data input terminal of said array.

12. A re-programmable logic array as in claim 11 further characterized by a clock source coupled to all of said charge storage elements of both said AND and said OR arrays.

13. A re-programmable logic array as in claim 12 further characterized by said second input terminal of each of said multiplexor means of the second through the n+k rows of charge storage elements being coupled to the output of the immediate preceding row of cells, whereby all of said charge storage elements are programmed by shifting serialized data supplied on said program data input terminal during one state of said multiplexor select signal and recirculating program data within each row of cells during a second state of said multiplexor select signal.

14. A re-programmable logic array as in claim 10 further characterized by each of said multiplexor means including a pair of transistors each having an input terminal coupled to respective input terminals of said multiplexor means, output terminals coupled together forming said output terminal of said multiplexor means and a control element, wherein said control element of the first of said pair of transistors coupled to said selector input terminal and an inverter coupled between said selector input terminal and the control element of the second of said pair of transistors.

15. In a programmable logic array having an AND array disposed for receiving n input signals, an OR array providing k output signals on k output lines and m term lines coupling said AND and OR arrays, wherein n, m and k are integers greater than one, said array comprising:
   a. AND array having n×m cells wherein each cell comprises:
      i. first and second transistor means coupled in series between one of said term lines and a reference potential, each of said first and second transistor means having a control element;
      ii. a first charge storage element coupled to the control element of said first transistor means;
      iii. one of said n input terminals being coupled to the control element of said second transistor means;
   b. OR array having m×k cells wherein each cell comprises:
      i. third and fourth transistor means coupled in series between one of said output lines and a reference potential, each of said third and fourth transistor means having a control element;
      ii. a second charge storage element coupled to the control element of said third transistor means; and,
      iii. one of said m term lines being coupled to the control element of said fourth transistor means.

16. An array as in claim 15 further characterized by a multiplexor means having a first input terminal coupled to the mth cell of each row of said cells, a second input terminal disposed for receiving program data, an output terminal coupled to the first cell of each row of cells and a selector input terminal disposed for receiving a multiplexor select signal for selecting between said first and said second input terminals.

* * * * *